United States Patent
Arkas et al.

(10) Patent No.: US 6,696,875 B1
(45) Date of Patent: Feb. 24, 2004

(54) PULSE CLOCK/SIGNAL DELAY APPARATUS AND METHOD

(75) Inventors: Evangelos Arkas, London (GB); Nicholas Arkas, London (GB)

(73) Assignee: Daidalos, Inc., Road Town Tortola (VG)

(*) Notice: Subject to any disclaimer, the term of this patent is extended or adjusted under 35 U.S.C. 154(b) by 0 days.

(21) Appl. No.: 09/936,963

(22) PCT Filed: Mar. 27, 2000

(86) PCT No.: PCT/GB00/01169

§ 371 (c)(1),
(2), (4) Date: Jan. 7, 2002

(87) PCT Pub. No.: WO00/59113

PCT Pub. Date: Oct. 5, 2000

(30) Foreign Application Priority Data

Mar. 27, 1999 (GB) .............................................. 9907038

(51) Int. Cl.[7] .............................................. H03H 11/26
(52) U.S. Cl. ...................... 327/277; 327/284; 327/291
(58) Field of Search ........................ 327/261, 263–264, 327/269–272, 276–278, 284, 291, 165, 166; 365/233, 233.5; 326/93

(56) References Cited

U.S. PATENT DOCUMENTS

| 4,674,516 A | * | 6/1987 | Hirota et al. ................ 600/447 |
| 4,691,302 A | * | 9/1987 | Mattausch ................... 365/240 |
| 4,714,924 A | | 12/1987 | Ketzler .................. 340/825.21 |
| 4,868,522 A | | 9/1989 | Popat et al. ..................... 331/2 |
| 4,961,169 A | * | 10/1990 | Matsumura et al. ... 365/189.12 |
| 5,095,233 A | | 3/1992 | Ashby et al. ................ 327/149 |
| 5,204,559 A | | 4/1993 | Deyhimy et al. ........... 327/232 |
| 5,369,646 A | * | 11/1994 | Shikatani ..................... 714/733 |
| 5,400,262 A | | 3/1995 | Mohsen ........................ 716/16 |
| 5,430,397 A | | 7/1995 | Itoh et al. .................... 326/101 |
| 5,570,045 A | | 10/1996 | Erdal et al. .................... 326/93 |
| RE35,483 E | | 3/1997 | Harrand ....................... 340/229 |
| 5,615,358 A | | 3/1997 | Vogley ........................ 713/501 |
| 5,742,798 A | | 4/1998 | Goldrian ..................... 713/400 |
| 5,881,271 A | | 3/1999 | Williams .................... 713/401 |

FOREIGN PATENT DOCUMENTS

WO    WO 91/19243    12/1991

* cited by examiner

*Primary Examiner*—Minh Nguyen
(74) *Attorney, Agent, or Firm*—Timothy J. Keefer; Wildman, Harrold, Allen & Dixon LLP

(57) ABSTRACT

A Pulse Clock Delay (PCD) apparatus (208) includes a selectable plurality (Nd) of series-connected pulse transition delay units (209) from a total plurality (Nmax) of such units. Each unit provides an incremental transition delay interval DELTA t. The PCD may be connected to a first intermediate proximal node (n1a) and an adjacent electrically isolated second intermediate node (n1b) where the first and second intermediate nodes are in a shorter (215a, 215b) of two signal paths having respective proximal and spaced apart distal ends (212, 216) in an electrical network. Control means (205), responsive to the difference in electrical length between the two signal paths (214, 215), configures the switchable selection means to select a particular number of delay segments such that the propagation of a first edge transition (102) through the series combination of the shorter first path (215a, 215b) and the delay segment (208) is delayed sufficiently to arrive at the second path distal end (216) within +/− DELTA t of the time of arrival of the first edge transition propagating through the second path. Multiple PCDs may be distributed on a PCB to compensate delay differences for multiple pairs of unequal length bifurcated clock/signal lines.

17 Claims, 10 Drawing Sheets

PRIOR ART

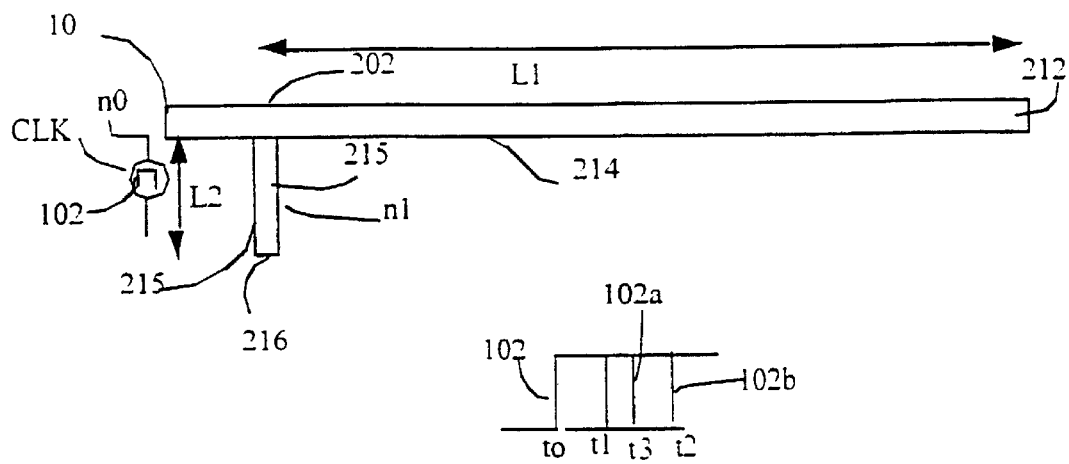
FIGURE 3
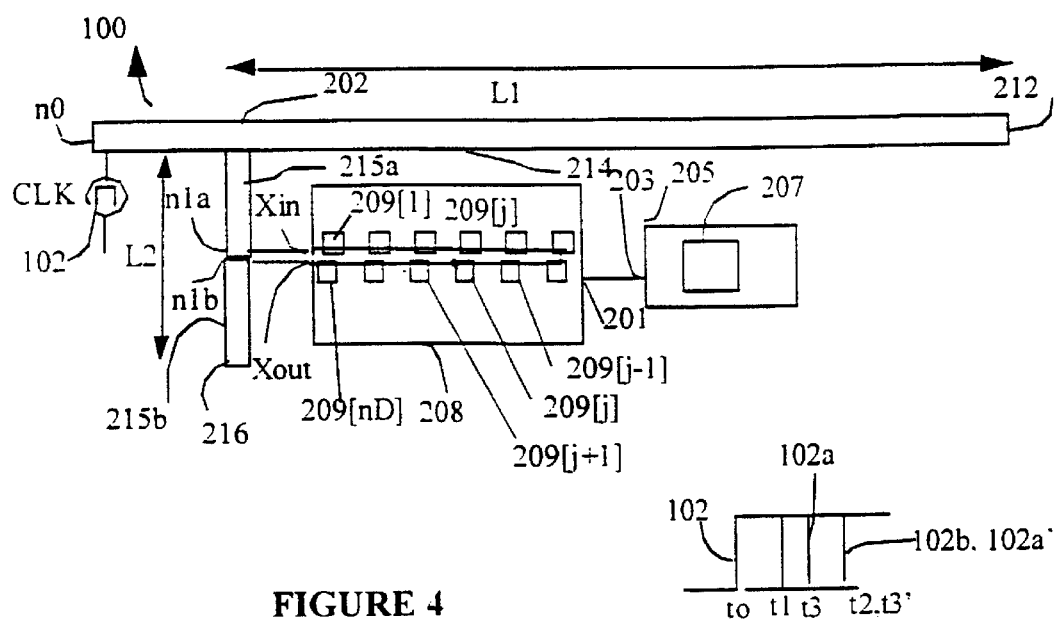
FIGURE 4
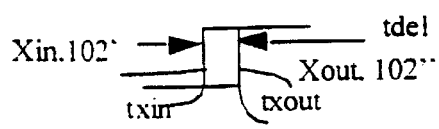

PULSE CLOCK/SIGNAL DELAY APPARATUS AND METHOD

BACKGROUND OF THE INVENTION

Electrical Networks

An electrical network consists of signal nodes connected by electrically active elements. The electrically active elements include conductors, linear passive elements and linear and non-linear active elements. A given network is partially described by the kinds of elements involved and the network geometry, i.e., the manner in which the various elements are grouped and interconnected at their terminals. Passive elements such as conductors, resistors, capacitors and inductors may be interspersed with active elements such as transistors, gates, integrated circuits and the like.

All of these elements may be considered branches of the network. The geometry of a network is described in schematic form by the nodes to which two or more terminals of the elements are connected. The electrical conductors of the network are themselves elements or branches of the network.

One portrayal of a network shows the geometrical interconnection of elements only, and takes the form of a graph; i.e. each element of the network is represented as a line having two small circles at either end denoting the terminals of the elements connected at a node.

In digital logic networks (circuits), active elements (devices) may have terminals that are bi-directional (sometimes operating as an input and sometimes as an output) but are generally unilateral, i.e., signal transmission for related terminal pairs proceeds in one direction only, e.g. from an input terminal to an output terminal. Even bi-directional terminals exhibit unilateral behaviour for certain time periods, e.g., during a portion of a system clock cycle or cycles when they are designated as input or output.

Complex Elements in Networks

Complex elements, such as logic arrays, microprocessors and memory components are generally represented as rectangular boxes with multiple lines extending to small circles denoting terminals. The lines are annotated to represent input and output logic variable names. For example, in FIG. 1, n1, n2 indicate signal node n1 and signal node n2, l(1,2) indicates a signal link or path between nodes 1 and 2. The links l(1,2) may be composed of any combination of passive and active elements connected in series-parallel combinations. That is, signal nodes n1 and n2 are connected by signal paths l(1,2) that may represent a simple conductor or may represent a complex bi-bilateral element such as a combined microprocessor/logic array or a series-parallel combination of many different kinds of each. Let S[r] represent all signal paths of interest for the network of FIG. 1.

Networks may be built from any one of a number of particular logic families, e.g., TTL (transistor-transistor logic), RTL (resistor-transistor logic), ECL (emitter-coupled logic), CMOS complementary-insulated gate and the like. Basic active elements, viz. logic functions, such as NAND, NOR, AND, INVERT gates, pass transistors are generally interconnected to form the complex elements described above which in turn are interconnected to form still more complex elements.

Network Element Delay

Complex logic elements may be characterised to a first order by a plurality of input and output terminals, each having a respective logic threshold. The logic thresholds at input and output (the voltage level or current level at an input or output terminal which defines the transition between a logic one and zero) may be the same or different. A logic function of a complex element, i.e., the logical response at an output from a logic transition at one or more activating inputs, typically can also be characterised as having a time interval or propagation delay through the active element or function between a logic transition of an activating signal at an input and a logic transition of a responsive signal (if any) at an output. The propagation delay is the time interval between the logic transition of the input signal at an input terminal and a corresponding logic transition of a respective responsive signal at a corresponding output terminal. The propagation delay of a branch or element is the interval or span of time between an input signal transition (for digital circuits, a logic transition) originating at one terminal of an element or branch until the occupancy of a corresponding output signal transition (or edge) at another terminal (the output terminal) of the element or branch by the propagation of the effect of the input signal through the element or branch.

A multiple terminal active element may have a multiplicity of signal edge delay time delay intervals between a particular pair of terminals associated with different functions or state transitions. Typically the design of electrical network systems will take into account a worst-case delay interval for such terminal pairs.

Another important feature of high-speed digital networks is the topology of the physical network. There is generally little correspondence between the topology of the schematic or network graph and the topology of the actual physical layout of the circuit elements and interconnections. Frequently, in translating a complex circuit design from schematic to printed circuit board (PCB) layout, the physical length (and consequently the electrical length or delay time) of the conductor traces between different nodes (terminals) of logic elements (due to the excessive signal edge delays caused by the interconnect) impacts the performance of the system so significantly, that the layout must be redesigned. Redesigning the layout adds significant cost and schedule delays in the process of introducing a new product to the marketplace. There is no assurance that a re-layout will not introduce another critical delay limitation in the same or some other path.

The propagation delays of circuit elements themselves can also be problematic. Components made by different component manufacturers may have inherent propagation delay times between input and output terminals that have different probability distributions. Worst case design to cover different ranges of propagation delay tend to decrease performance for lower cost devices, or increase cost for higher performance (i.e., faster or tighter distribution) devices. Some physical layout design tools are available from Computer Aided Design Tool services and manufacturers that are typically used to analyse the performance and timing of topological layouts for instances of limitations caused by the delay issues discussed above. Once a problem is identified, components may be relocated and a timing analysis run again. This layout-analysis step often can become a loop procedure repeated several times until the performance is satisfactory.

The propagation delays between input signal transitions and output signal transitions of logic elements and of the interconnect (branches) between nodes (terminals) is one very significant feature of high speed networks. A series connection of two or more branches forms a signal path having an associated cumulative signal propagation delay.

The cumulative propagation delay, $t_d$, of a signal path composed of a series of branches, $1 \leq k \leq K$, is sometimes approximated by computing $$t_d = \Sigma t_k,$$

the simple arithmetic sum of the propagation delays of the series branches, $t_k$.

Another useful approximation is the geometric sum of the individual branch propagation delays:

$$t_d = \sqrt{\Sigma t_k^2}.$$

Generally, the total branch delay intervals lie between these two approximations.

Practical Considerations to Signal Delays

For complex, high performance networks, such as computer motherboards and microprocessor chips the delay time delay interval of the interconnect (i.e., wires and PCB traces) can have a significant impact on the maximum speed of the network. Particularly as the operational cycle time of computer chips and boards increases to 300–400 and 500 MHz the length of half a clock period is decreased from 15 to 12.5 to 10 ns. Since the speed of an electrical signal on a PCB can be about 1.5 ns per foot, for an 18 inch PCB the time delay of a signal propagating along an interconnect line can amount to 10 to 15% or more of the time allocated to the to the computing circuits. This is an unacceptable penalty for performance. In some cases, a critical signal may be delayed sufficiently in one part of the physical layout that the network will not operate at the desired clock frequency. In such a situation it may be necessary to add an extra clock cycle or wait state to the system operation, to allow the lagging signal to be used in the next system cycle. The critical delays may be associated with clock signals or data signals or both.

A good discussion of the challenges presented for designing and building high speed digital systems is found in the March, 1998 issue of Computer Design magazine from pages 27 through 35. Clock and signal skew can be effected by a host of factors: manufacturing and component tolerances vary statistically around some mean value. Output loading of drivers and input loading of receiver can vary as well. Cross sectional tolerances of fine-pitch PCB can vary as well up to 5 to 10% or worse. Dielectric constant variation in the surface layer of a PCB or differences between layers can result in substantial differences in equal length signal lines routed on different layers.

A motherboard designed to accept components from many different suppliers might force the design engineer to make undesirable worst-case assumptions about partitioning the clock and the allowable skew. At today's high clock (and signal) speeds, interconnect is just another component in the clock-signal chain.

Impedance matching and Schottky-diode clamping can improve rise-time and overshoot problems but do not contribute to a solution to the variability of signal/clock delay interval through the logic element-interconnect chain.

Some techniques for addressing the delay variability problem include careful layout of power and ground planes of a PCB; isolating all high-frequency components (processor, clock generator, chipset, etc.) by placing them over an isolated ground plane. Alternatively, a common ground plane can be used for the entire board, with two or three internal ground layers inside the PCB. Other techniques include high-speed differential drivers, specialised clock-distribution topologies (Star, point-to-point-routing, distributed low-frequency clock generators driving local PLL multipliers for local high-frequency clocks). Hand routing of clock traces before any other signals are placed is another good design practice. Other design practices limit the placement of clock generators, crossing of clock traces, and eliminate the use of sockets for clock generators. Almost all of these techniques require additional board space, increase component cost, and increase manpower required for design and verification of the layout.

Signal Delay Mismatch and Prior Art Solutions

With regard to FIG. 3, there is shown a schematic representation of a clock line 10 in an electrical network, e.g., a PC motherboard. The clock line 10 has a node n0 connected to a clock generator CLK that produces a clock signal edge 102 at node n0 that occurs at time instance t0. The clock signal edge 102 propagates from node n0 at one end of the clock line 10 to an intermediate node 202. The clock line 10 splits into two branches 214 and 215 with proximal ends joined at node 202 to distribute the clock signal 102 to different parts of the circuit, e.g., spaced apart node 212 at a distal end of clock conductor segment 214 and node 216 at distal end of clock conductor segment 215. For the present discussion impedance matching is assumed but not shown. The conductor 214 is of length L1 from node 202 to node 212. The conductor 215 is of length L2 between node 202 and node 216. L2 is electrically shorter than L1. The clock signal edge 102 propagates from proximal node 202 to distal nodes 212 and 216. After travelling the length of L1 and L2, edge 102 arrives at node 212 at time t2 as edge 102b and arrives at node 216 at time t3 as edge 102a. Since L2 is electrically shorter than L1 t3−t0 is less than t2−t0.

The extra delay of edge 102b over that of 102a, i.e., t2−t3 (clock timing skew) can cause logic function errors in circuits connected to clock signals at nodes 212 and 216. If logic circuits (e.g. microprocessor, memory chips, not shown) connected to the two nodes 212, 216 are connected to input logic signal lines (not shown) that have logic levels changing near the edge time t0, they can latch incorrect output logic levels because of this timing skew.

Selectable Time Delay (STD) Circuit Elements Inverter Chains; Reference Examples Circuit elements having extra time delays may be inserted into the shorter electrical path L2 to bring the signal edge 102a into synchronism with edge 102b. For example, a series chain of inverter pairs each having a small propagation delay, Δt, can be inserted into line L2 to add extra delay to a delayed edge of 102a. Alternatively, a circuit element having a controllable delay time can be inserted. Examples of these are active hybrid delay lines and Silicon Timed Circuits (STCs) by Dallas Semiconductor, Dallas, Tex. The STCs are offered in the two basic architectural types of delay lines: a single input with multiple outputs (taps) with delay elements between each, and single input/single output delays, usually with multiple independent delays in a single package.

Both of these derive time delays from voltage ramps obtained from charging selectable members of a capacitor array with a constant current and detecting the time when the voltage ramp crosses some threshold. Different time delays may be selected by choosing one or more of the parameters, threshold voltage, ramp current and capacitor value.

Connection of the Time Delays Into Selected Signal Paths Crosspoint Switches Once a signal path needing additional signal delay is identified the path must be opened and the STD having the desired additional delay inserted. Methods of inserting additional circuits into other circuit paths are known. U.S. Pat. No. 5,400,262 by Mohsen, describes a "interconnect matrix array" (the '262 matrix) that allows any one of a set of input/output pads (or conductive lead end terminals) arranged in an area matrix to be connected to any other one of the set of pads (end terminals). Mohsen's array or crosspoint switch is comprised of a first set of conductive leads formed in a first direction, a second set of conductive leads formed in a second direction, the second direction being not parallel to the first, and programmable element structure for electrically interconnecting selected ones of the conductive leads in the first set to one or more of the conductive leads of the second set at respective crossing points. Selected ones of the conductive leads are segmented. Associated with each row and column of input/output pads/leads is a channel having one or more parallel conductive tracks each capable of being broken into segments. The '262 matrix provides great flexibility in interconnecting external circuit connections. However the '262 matrix has the disadvantage that for practical circuits, an equal number of multiple tracks are required for each desired input pad and output pad interconnection (i.e., terminal ends). This causes a rapid increase in the circuit area of the switch and the introduction of possible undesired signal noise coupling between different signals on closely adjacent tracks.

Other cross point matrix configurations are known, such as Reissue patent RE35, 483 ('483) by Harrand. In FIG. 3 of Harrand any output column m is connected to any input row n by a crosspoint switch element. Each column and row comprise two differential lines Oj1, Oj2 and Ii1, Ii2. The crosspoint switch element comprises the two drains of a differential amplifier M1, M2. M1 and M2 are differentially driven by separate drains of another differential pair M3, M4 whose gates are driven by the differential row inputs of row n. Two selection lines Sij and Sij* (the complement of Sij) enable the differential pair M3, M4.

The matrices of '262 and '483 both have the common disadvantage that selection lines (e.g., Sij and Sij*) that enable the connection of a row to a column must run across the full width and breadth of the matrix. The disadvantage arises from two factors: first, the size of the array must accommodate space for the signal rows and signal columns in addition to the space for the selection lines. For practical arrays, this means there must be space for twice the number of lines crossing the array in both X and Y directions.

Second, for very high-speed signals in such cross point switch matrices, there will be coupling between selection lines and signal lines when they are closely spaced. This can be seen with reference to the matrix shown in FIG. 2, that depicts a simplified schematic of a typical crosspoint matrix such as that of the '262 and '483 patents. Like many other prior art cross point switch matrices, matrix has crossing (e.g., X and Y axis) input and output signal lines running the full width and breadth of the array. Programmable elements a 102(1n,m) connect the signal row lines Ri/o,[n] to signal columns lines Ci/0,[m] when enabled by suitable logic levels on the respective row select input 104,n,m and column select input 106,n,m.

Row select lines 104,n and column select lines 106,m provide the logic levels to the respective switch row and column select inputs and also run the full width and height of the array respectively. Again, the programming lines for selected rows rsel,n and for selected columns csel,m take up more array space, i.e., a larger array for a given number of interconnections to be made, and also are subject to noise coupling between closely adjacent programming lines and I/O signal lines.

It would be advantageous to combine a selectable delay circuit element with an interconnection element that could provide selectable propagation delay to selected circuit paths while minimising increased circuit area and minimising noise coupling between I/o signal lines and programming lines.

C. Summary

Pulse Clock Distribution (PCD) System and Method

The present invention provides a method and system for correction of unwanted delay mis-matches that exist or are introduced between respective clock signal and/or data signal edges in corresponding clock and/or signal paths.

Signal Path Transition Edge Delay Equalization

The method and apparatus of the present invention provides for introduction of a series connection of a selected number of elemental signal edge transition delay units in series relationship with an electrical path propagating a selected clock signal or data signal of an electrical signal network. An edge transition equalisation system incorporating a signal transition edge delay controller that may be connected to a multiplicity of such signal edge delay units in selected branches of a pulsed signal network.

An embodiment of the present invention may be used as an apparatus for a novel method for inserting or interposing additional signal edge transition delays in one or more of selected signal branches.

Clock/Signal Pulse Edge Distribution and Control

The present invention provides an apparatus and method for distributing clock/signal pulses with selected signal transition edge instances delayed by a selectable propagation delay from an initiating clock/signal pulse edge transition. Insertion of an embodiment of the programmable delay line of the present invention into one signal path (branch) of a multi-branch clock/signal line causes a first clock/signal edge at one node of the one branch to occur at an edge time instance (the edge time) simultaneously with the edge time instance of a second clock/signal edge from the same initiating clock/signal pulse edge but propagating on an electrically longer bifurcated branch portion of the same clock/signal line.

One feature of some embodiments of the present invention is a novel diagonal cross point (DCP) matrix used to connect the selected number of propagation delay line elements into the desired signal or clock line. The DCP provides isolation between the row/column select lines and the row/column signal lines in two ways. First, the row select and column select lines for any selection switch of a linear array of select switches are disposed on one side of the linear array and the row signal lines and column signal lines are disposed on the opposite side of the array. Secondly, each selection switch of the array provides isolation between the proximal end of the select lines and the proximal end of the signal lines.

DESCRIPTION OF DRAWINGS

FIG. 3, depicts a schematic representation of a clock line 10 in an electrical network with different electrical length (delay) clock branches between two network nodes.

FIG. 4, shows a modification in the clock line circuitry of FIG. 3 incorporating an embodiment 208 of the PCD of the present invention.

FIG. 6 illustrates a block diagram of a larger network with a portion of the clock line 10 of FIG. 4 modified to include an embodiment of the PCD system 208 of the present invention shown as.

DETAILED DESCRIPTION OF THE INVENTION

Figure 1:
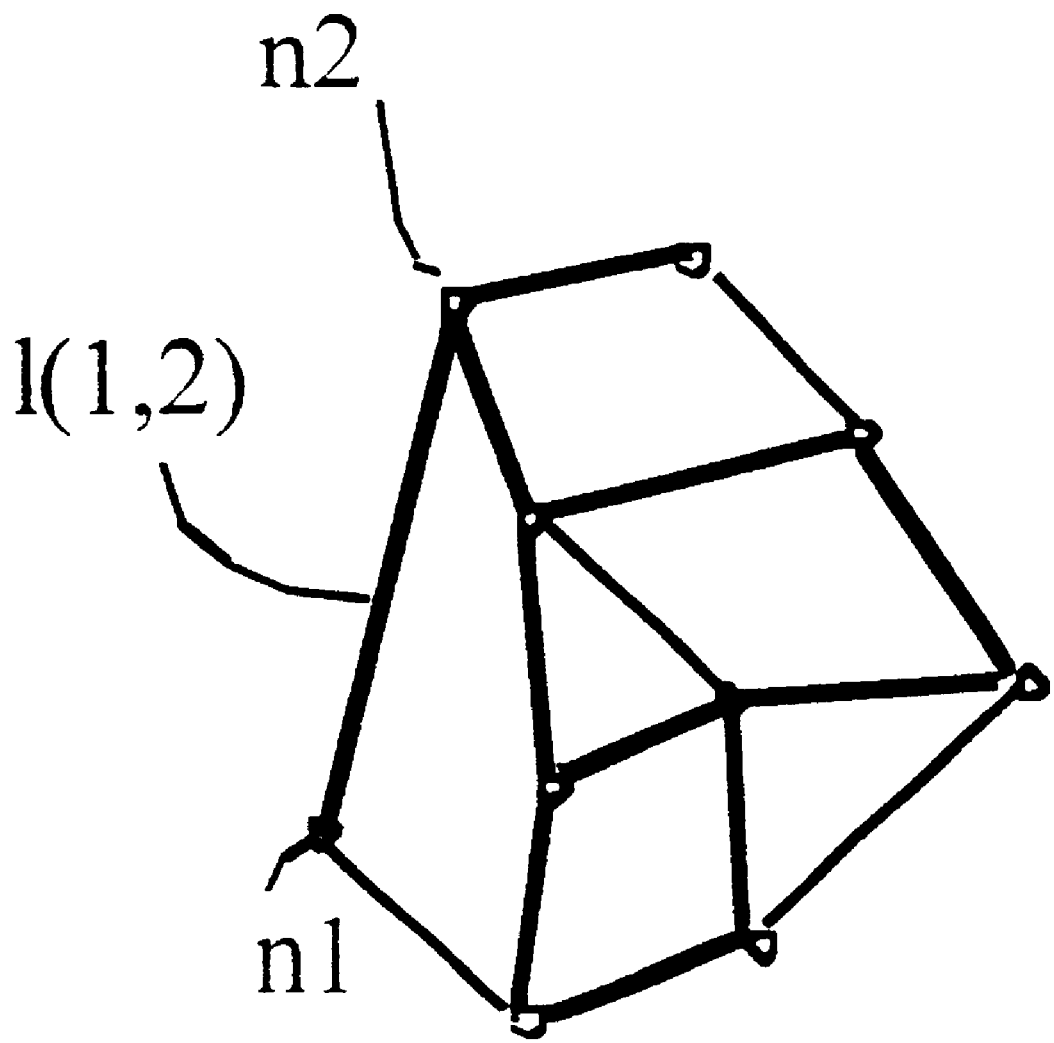
FIG. 1 is an illustration of electrical network nodes and branches.
Figure 2:
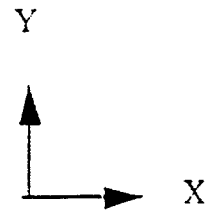
FIG. 2 shows typical prior art cross point switch architecture.
Figure 2:
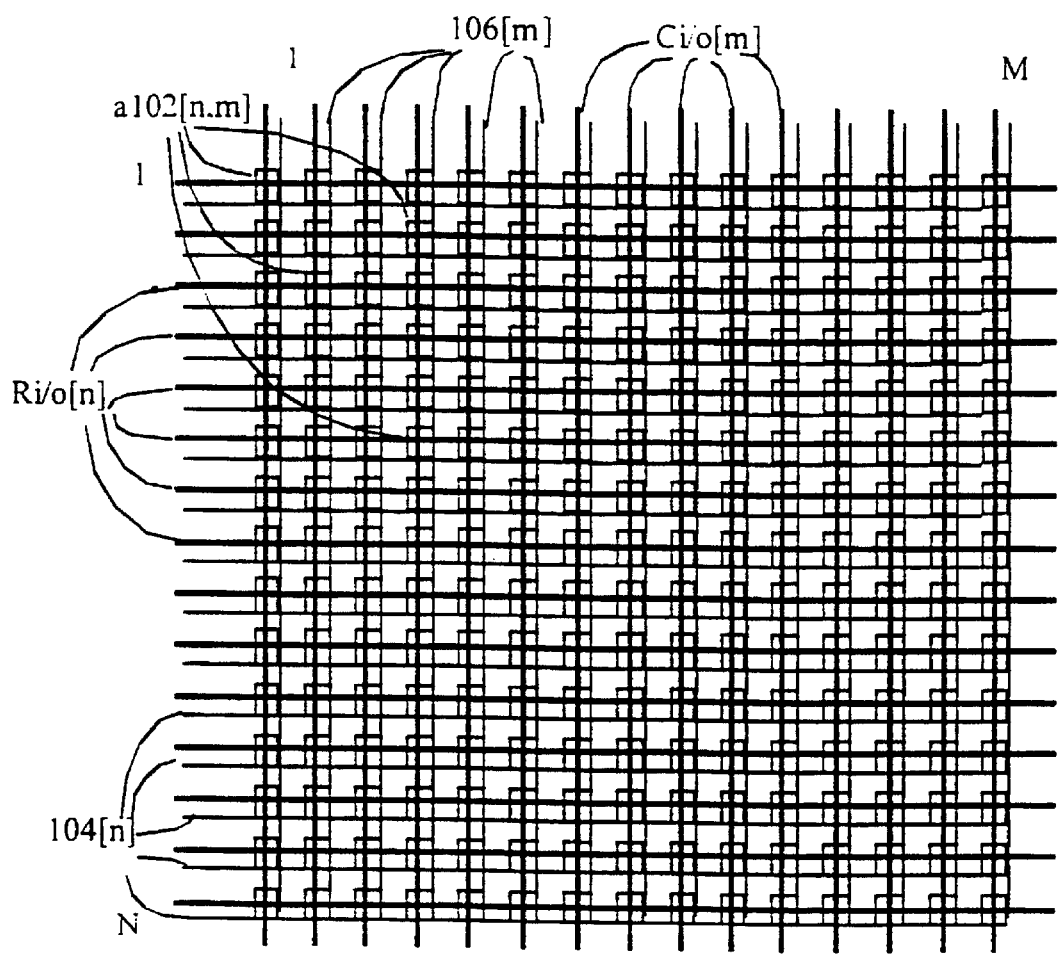
Figure 5:
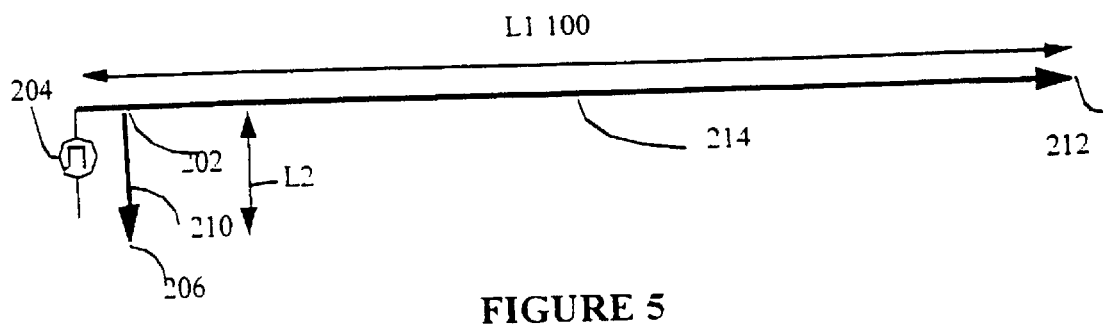
FIG. 5 depicts a simplified schematic representation of FIG. 3.

The Pulse Clock Distribution apparatus of this invention will be described in conjunction with several embodiments. Other embodiments will be apparent to those skilled in the art in view of the following description. The following descriptions are meant to be illustrative only and not limiting.

A Single Edge Delay Generation Embodiment of the PCD

With reference to FIG. 3 and FIG. 4 an embodiment 208 of the present invention modifies the structure of the clock line 10 in FIG. 3 to that of the clock line 100 of FIG. 4. The clock line 100 is modified by PCD 208 to equalise the edge delay at separated circuit nodes receiving a pulse edge from a common source. The shorter conductor 215 of FIG. 3 is divided at an intermediate node n1 into two electrically isolated conductors 215a and 215b. The conductors 215a and 215b are separated at node n1 just enough to define immediately adjacent, electrically isolated nodes n1a and n1b. Nodes n1a and n1b are respectively connected to input and output nodes Xin and Xout of an embodiment of PCD device 208 of the present invention. Node n1a and n1b only need to be separated sufficiently to electrically isolate conductors 215a and 215b without significantly changing the length L2.

The PCD device 208 is an electrically programmable delay generator comprised of a plurality, Nd, of delay elements 209[j] each having a respective input and output with a respective increment of propagation delay, Δt, there between. The plurality of delay elements 209[j] are connected in series between Xin and Xout. A first one of the delay elements 209[1] has its input connected to Xin, and a last one of the elements 209[Nd] has its output connected to Xout. Each element 209[j] except the first and last has its respective input and output connected to the corresponding preceding and following element 209[j-1] and 209[j+1].

The clock signal 102 propagates from node n0 to node n1a along clock line 100 and segment 215a and appears on Xin as a delayed input signal edge 102' at time txin. The signal edge 102' is received by the input 262 of the first element 209[1]. Each delay element 209[j] adds an increment of propagation delay, Δt, to the delayed input clock signal 102' propagating from the first element 209[1] in series to the last element 209[Nd]. The last element 209[Nd] outputs a further delayed clock signal 102" at Xout that is delayed by the sum of the Δt's of the Nd elements 209[j]. The number Nd of elements 209[j] is arranged so that sum of the Δt's, ΣΔt, for the Nd elements 209[j] adds to the delay of the signal 102' to produce a final delayed clock signal 102a' which appears at node 216 in synchronism with the clock edge 102b at node 212 within one Δt; i.e., ΣΔt=t2−t3+/−Δt.

The selection and connection of the Nd delay elements 209[j] is carried out by co-operating switch connection control circuits (not shown) in the PCD 208. The switch connection control circuits in 208 may be of the conventional selector and multiplexor types known in the art or may be as described by the '262 and '483 patents, e.g., variations of the cross point matrix shown therein. For example, a cross point switch may be used to connect the output of the Ndth element of a series of Nmax elements to the output Xout, where Nmax>Nd.

A preferred embodiment of the present invention includes a controller 205 with a control program 207 combined to provide control signals 203 to control input 201 of the PCD 208 that selects and connects at least Nd out of Nmax delay elements 209[j] to produce the desired delay.

Referring to the timing diagram of FIG. 4, the signals 201 on time delay control input 203 in combination with the switch connection control circuits (not shown) causes the PCD 208 to insert a desired propagation delay, tdel, between the instance, txin, of the delayed clock pulse 102 received at Xin and a corresponding instance, txout, of a further delayed output pulse clock edge 102" at Xout at the node n1b. One method of the generation of control signal 201 and the method of selecting tdel is described generally below. The value of tdel is selected so that the instance t3' of the delayed clock signal edge 102a at node 216 is delayed equally (within one Δt) with that of signal edge 102b at node 212; therefore t3+tdel=t3'=t2.+/−Δt.

Embodiments of the PCD 208 invention of FIG. 4 are preferably implemented by tapping from a selected one of an intermediate stage of a long series chain of incremental delay elements as described. Alternatively, prior art programmable delay devices such as hybrid delay lines known in the art or programmable delay devices such as the SCTs by Dallas Semiconductor may be used as the delay elements 209[j]. The connection of a Ndth output of a series of Nmax elements may be implemented by conventional selector/multiplexor circuits, with a prior art cross point switch as shown in the '262 patent or the '483 reissue, or with a novel diagonal cross point (DCP), described below, that is a feature of embodiments of the present invention.

Figure 7:
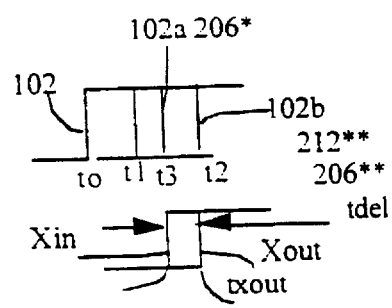
FIG. 7 indicates the relative timing of a delayed clock edges at different nodes on clock line 10 of FIG. 5.
Figure 6:
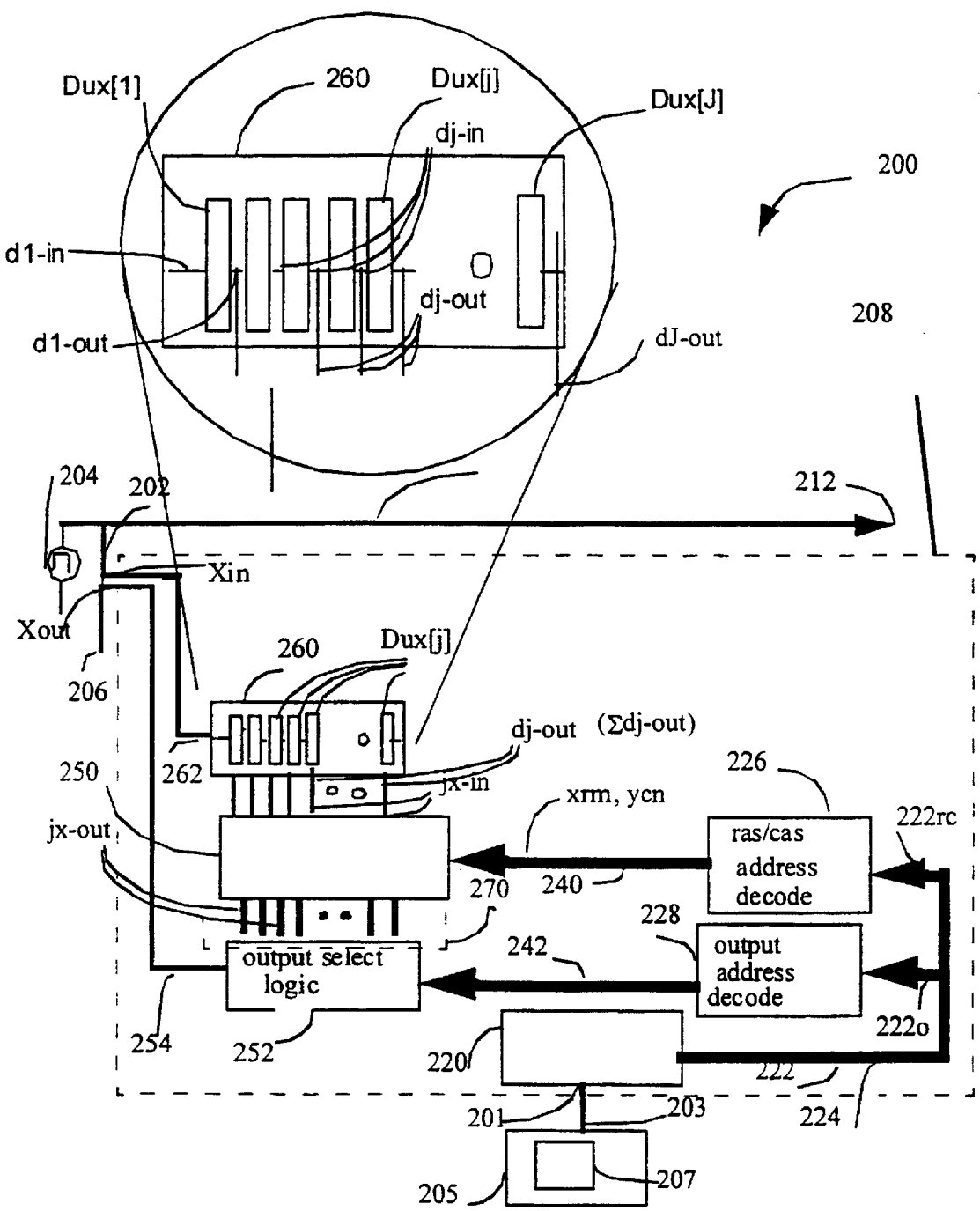

Detailed Functional Block Diagram of one Single Edge Delay Embodiment of the PCD Referring to FIGS. 4, 6 and FIG. 7, the clock line 10 of the digital network in FIG. 3 is modified to clock line 100 of FIG. 4. Clock line 100 includes an embodiment of the PCD system 208 of the present invention shown in a more detailed block diagram.

Referring to FIG. 6, and the timing diagram of FIG. 4, there is shown a more detailed block diagram of an embodiment of the PCD 208 included in a portion of the clock line 100 for a digital controller network 200.

The clock line 100 is driven at the first clock node 202 by a clock source 204 (CLK). The first clock line (branch) 215a, 215b of length L2 connects the clock node 202 to a nearby first portion of the network 200, e.g., a counter register input clock node 216. The (electrically) longer second clock line (branch) 214 of length L1 also connects clock node 202 to another more remote portion of the network 200, e.g., a spaced apart address register input clock node 212. L1 is considerably longer (electrically) than L2.

FIG. 7 shows the relative timing of the fast rising clock edge 102 at input node 202 originating at time instance t0. The clock edge 102 divides at node 202 and propagates along the bifurcated clock line branches 215a, 215b and 214 and arrives as a first delayed clock edge 102a and second delayed edge 102b at nodes 216 and 212 respectively. The first delayed clock edge 102a arrives at delay instance t1 from edge 102, and the second delayed clock edge 102b arrives at second delay instance t2 from edge 102 due to the longer branch length L1.

The clock branch 215 of FIG. 3 is electrically separated at node n1 into two electrically separate nodes, n1a and n1b connected respectively to an input node Xin and a delayed output node Xout, leaving the line lengths L1 and L2 essentially the same as before. Node Xin and node Xout are connected to the PCD 208. The PCD 208 receives the clock edge 102' at the input node Xin and outputs a delayed clock signal edge 102" at the delayed output node Xout. With regard to FIGS. 6 and 7, the PCD 208 adds additional propagation delay tdel to the clock edge 102a.

Propagation delay tdel consists of two portions: the selectable delay $\Sigma \Delta t$ and excess delay, txs, contributed by supporting circuitry within the PCD 208. Txs represents fixed propagation delays (the sum of parasitic delays) within the PCD 208 caused by the physical structure of any particular embodiment of PCD 208, not contributed by the selectable delay elements 209[j]. As such, Txs allows the delay characteristics of the PCD 208 to be represented as an assembly of ideal, i.e., zero delay components in series with the selectable delay $\Sigma \Delta t$ and the hypothetical excess delay, Txs.

PCD 208 generates delay tdel between Xin and Xout to produce an intermediate delayed clock edge 102" at Xout. The intermediate delayed clock edge 102" is arranged to cause the further delayed clock edge 102a' (edge 102' delayed by tdel) to arrive at the register node 216 coincident with the arrival of the clock edge 102b at register node 212. The selection and connection structure and method of adjustment of the delay interval tdel, for the embodiment 208 of the present invention is described in detail below.

PCD Functional Blocks

The PCD 208 includes a series delay unit block 260, row access select/column access select (RAS/CAS) decode block 226, a timing control block 220, a RAS/CAS address decode block 226, an output address decode block 228, a diagonal cross point select matrix 250, and an output select logic block 252.

Series Delay Block.

The series delay block 260 has a delay block input 262 connected to the node Xin that receives the delayed clock edge 102'. The series delay block 260 includes a series string of Nmax spaced apart delay units 209[j], where j is an integer, $1 \leq j \leq Nmax$. A first delay unit 209[1], has a first delay unit input 211[1] connected to the input 262 and a first delay output 213[1]. Each successive delay unit 209[j], $2 \leq j < Nmax$ has a corresponding delay input 211[j] and delay output 213[j]. Each delay unit, 209[j], is characterised by an incremental delay $\Delta t$ between an input logic transition Xin[j] at its input 211[j] and an output logic transition Xout[j] at its output 213[j]. Each delay unit 209[j] has its output 213[j] connected to the input 211[j+1] of the next delay unit 209[j+1]. The time delay between a logic transition Xin[1] a the first input 211[i] and an output transition Xout[j] at the jth output 213[j] is $j*\Delta t$. A delayed clock edge Xout[j] therefore appears at each output 213[j] with a delay of $j*\Delta t$ from the initiating clock edge 102' at node Xin. Adjacent delay units 209[j] are spaced closely enough so any time delay between an output 213[j] and a following input 211[j+1] is negligible compared to $\Delta t$.

The delay units 209[j] may be selected from standard hybrid delay lines, commercial delay devices such as a family of STC delay devices of Dallas Semiconductor, or specific delay units described further below.

Timing Delay Control Block

The timing delay control block 220 has a timing control input 201. Input 201 receives timing control input signals 203 from a system control function 205 (e.g., a hard wired logic circuit, micro programmed controller or microprocessor operating a predefined control program 207 stored on ROM, RAM, disk or similar storage device) for controlling the relative timing of the clock edges 102b and 102a' at nodes 216 and 212.

Control block 220 is a conventional combinatorial conversion logic block that converts timing control commands 203 from the system control function 205 and outputs suitable timing delay address signals 222 on address bus 224. The logic for converting control commands 203 to address signals 222 will typically be specified by a manufacturer of an embodiment of a PCD device 208 or by a user of a programmable embodiment of the PCD device to provide a user with a limited set of commands 203 to be used to generated the stored program 207. The specification and design of timing delay control block conversion logic is within the capability of an ordinary practitioner of logic and circuit design and is not part of the present invention.

Control Function 205

Control function 205 interprets stored program commands (not shown) from the program store 207 according to the specific network requirements and provides necessary control signals 203 to input 201 of the timing control block 220. The design of suitable conversion logic structures for the control logic block 205 depends partially on the requirements of a particular digital system implementation, which incorporates the PCD 208 of the present invention. The specification and design of such logic conversion structures depends on the specific requirements for a particular network 200. Such specification and design is within the capabilities of a knowledgeable practitioner of system and digital logic design and is not part of the present invention. Function 205 typically will be supplied by a system designer who wishes to implement specific corrective and/or system compensation delay functions by using the PCD of the present invention as part of the network 200.

RAS/CAS Decode and Output Address Decode

RAS/CAS decode block 226 decodes the address signals 222[r,c] ($1 \leq r \leq R$ and $1 \leq c \leq C$) and drives decoded matrix select lines 240. Matrix select lines 240 include RAS delay select signals xr[m], $1 \leq m \leq M$, and CAS delay select signals yc[n], $1 \leq n \leq N$. In the single output delay embodiment of FIG. 6, the RAS/CAS address signals 222[r,c] are mapped so that M=N and each one of the [r,c] bit combinations produce a single logic one on a specific one of the RAS select signals xr[m] and a specific one of the CAS select signals yc[n]. Similarly, output address block 228 decodes the output address signals 222[o] $1 \leq o \leq O$ and produces decoded output select signals 242. The decoded output select signals 242 connect to output select logic block 252.

The RAS/CAS decode block 226 is typically a conventional combinatorial logic function for selecting specific xr[m] and yc[n] lines from the address signals 222[r,c] in order to enable a specific switch sx[j]. Again, the specification and design of such conventional logic is not part of this invention and can be done by a person having ordinary skill in the art.

Cross Point Select Matrix Switch

The cross point select matrix 250 includes Nmax independently selectable switches, sx[j]. $1 \leq j \leq N_{max}$. Each switch, sx[j], separately receives a corresponding one of delayed matrix outputs signals 211[j] from the delay block 260. Each one of the plurality of delayed output signals 211[j] are individually connected to a corresponding input xin[j] of the respective switch sx[j]. Each switch sx[j] has a switch output xout[j] connected separately to the output select logic block 252. Each of the logically selectable switches, sx[j], connects (on when selected) or disconnects (off when deselected) the corresponding output xout[j] to the respective input xin[j] allowing the selected delayed clock/ signal 211[j] (i.e., the edge 102' delayed by +j*Δt) to pass there through.

To select a particular delay, Nd*Δt, the Ndth one of the logically selectable switches sx[j] is selected (on) by the corresponding one unique combination of logic true levels on the RAS/CAS select lines. A particular switch sx[j] is selected by a logic one (1) on the particular corresponding one of the RAS delay select lines, xr[m], $1 \leq m \leq M$, and a logic one (1) on the particular corresponding one of CAS select line, yc[n]. $1 \leq n \leq N$, where M and N are integers. The mapping from n,m to j is fixed for the single edge delay embodiment PCD 208.

Each selected (on) switch xout[j] therefore separately connects the corresponding delayed signal (edge) 211[j] (i.e., Xin delayed by the corresponding delay j*Δt) to the output select block 252. A unique one of the switch outputs xout[j] is selected by appropriate address pair xr[m], yc[n] from the address bus 240 from the RAS/CAS address decode 226. The system controller 205 is programmed to output the necessary address pair xr[m], yc[n] to select the correct switch xout[j] according to the control program 207 and the desired value of tdel.

In the embodiment 208 of a single time delay selection, m=n, and M=N=Nmax, and the decode 226 is arranged to select only one row (xr[m]) line and one column (yc[n]) at a time. A delayed clock/signal output line 254 from output select logic block 252 connects the selected signal to the output Xout through the fixed (hypothetical) delay txs.

For the purpose of this discussion, the time delay from the input Xin to the first input 211[1] and the time delay from the output 213[Nd] to Xout will be assumed to be small compared with the delay intervals of interest. It can be shown that small excess time delays caused by finite conductor lengths and parasitic reactive loads (inductive and capacitive loading) between physically separated nodes of the delay block 260, the select matrix 250, the output select logic 252, the input nodes Xin, node 262 and output nodes 254, Xout can be compensated by selection of a suitable number of delay units 209[j].

In addition, any excess time delays caused by the non-ideal physical traces and parasitic reactive loads in the PCD 208 are accounted for by lumping the excess delays into the effective fixed delay, txs in series with the selectable delay $\Sigma \Delta t = Nd*\Delta t$.

More General Embodiments of the PCD of the Present Invention

FIG. 6 has shown a specific embodiment of a single edge delay control and compensation system. A large body of alternative embodiments of PCDs in accordance with the present invention will be apparent to a person having ordinary skill in the digital system design art. For example, multiple sets of PCDs may be placed on one network to compensate more than one pair of discrepant signal path delays S1 and S2. Other alternatives in accordance with the present invention include PCDs capable of selecting and connecting more than one single delayed edge derived from one originating edge 102 as shown with regard to FIG. 6.

Multiple delayed edges 102(time0+n*Δt) that occur at different delays n*Δt from an originating edge 102 at time0 can be combined and inserted onto the signal path 215a, 215b by merely changing the control program 207 and the address logic of blocks 220, 226 and 228 into a signal path.

For an example of a more general case, more than one output switch sx[j] with a single address 222[r,c] may be selected by chancing the mapping of the signals 222[r,c] to the select lines xr[m] and yc[n] such that the address decode 226 enables more than a single switch sx[j] for each address 222[r,c]. A subset of switches E sx[j] may then be selected by a single address 222[r,c] to connect a corresponding subset of delayed signals E xout[j] to the output select logic 252 and the output address decode 228 logic may be easily arranged to connect each of the subset E xout[j] to the Xout line.

Output Address Decode and Selection

The output select logic block 252 receives the subset of selected signal (edges) E211[j] through the selected set of switch outputs Exout[j]. For a single time-delay-generator embodiment 208 of the present invention, two possibilities exist:

A) First, appropriate logic functions (not shown) for the select logic block 252, the output address decode block 228 the control logic 220 and the system function 205 may be chosen by a knowledgeable logic design practitioner so that the system function 205 will cause the output select logic to select a single required switch, xout[j], for connecting the desired single one of the delayed outputs 211j to be routed to the delayed output 262 by choosing to appropriately drive only the corresponding one of the switches sx[j] to which it is connected from among the whole set of delayed outputs, Nmax. One knowledgeable in the art may select any one of a number of known logic functions.

Figure 8:
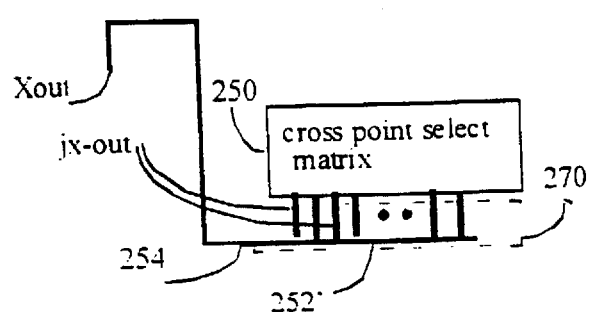
FIG. 8 exhibits an alternate embodiment of the output select logic for the PCD 208 shown in FIG. 6.

B) With reference to FIG. 8, an alternate embodiment of the single time delay generation may be implemented by replacing the output select logic block 252 with a wired AND connection 252" of the outputs xout. In this case the RAS/CAS addresses are limited to those which only select a single one of the outputs xout at a time. This can be implemented in the control program 207 of the digital system incorporating the PCD 208.

Diagonal Cross Point Select Matrix

Figure 9:
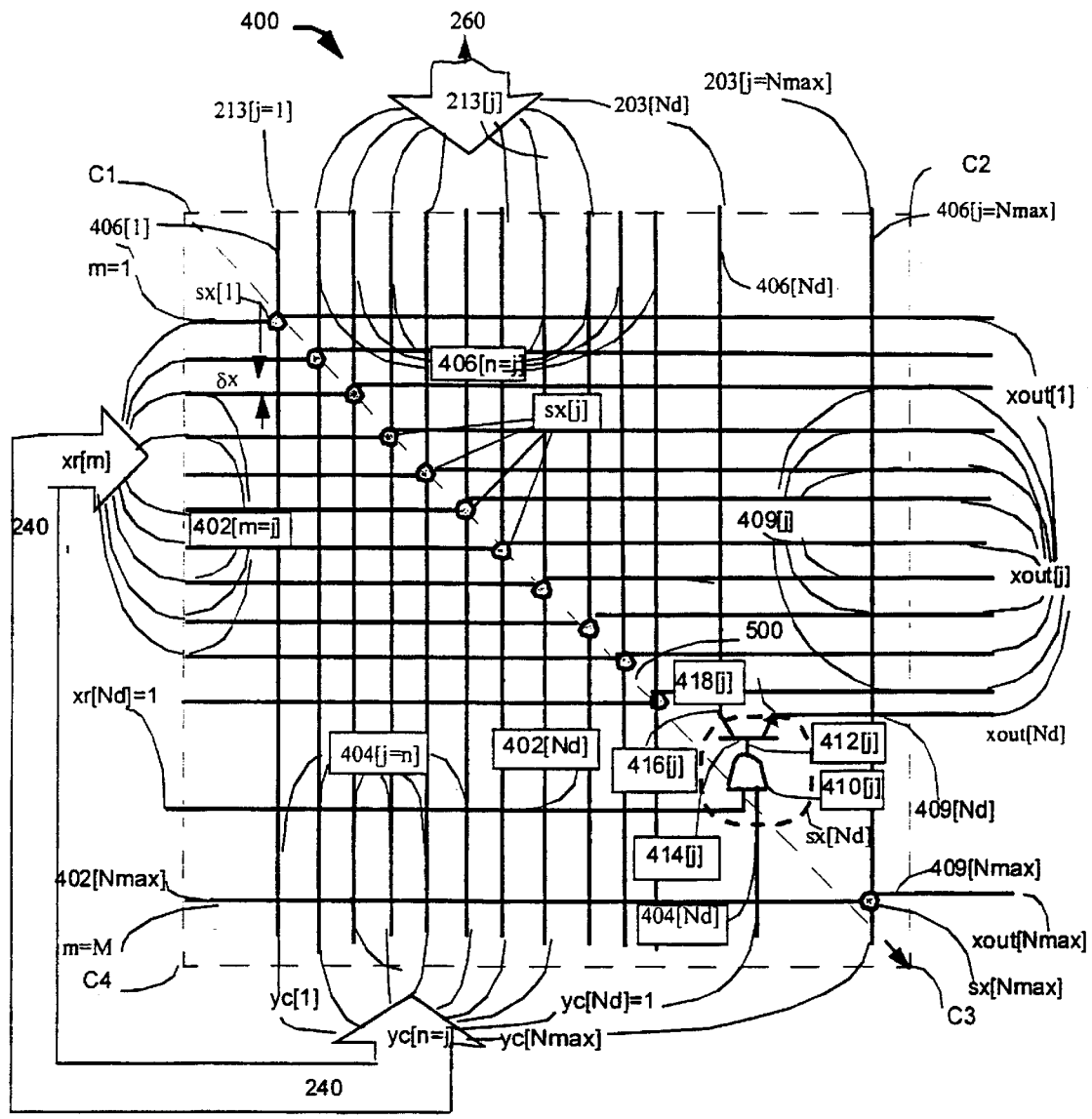
FIG. 9 presents a more detailed schematic representation of a novel embodiment 400 of the cross point select matrix 250.

With reference to FIG. 9, there is shown a more detailed schematic representation of a novel diagonal cross point (DCP) matrix 400 performing the function of the cross point select matrix 250.

The cross point 400 includes; a) M parallel and spaced apart row select input lines 402[m] each connected separately at an outer peripheral end to a corresponding one of the RAS select lines xr[m] of the matrix select bus 240; b) N parallel and spaced apart column select input lines 404[n] each connected separately at an outer peripheral end to a corresponding one of the N CAS select lines yc[n] of the matrix select bus 240. The M row lines 402[m] are not parallel to the N column lines 404[n] and are directed proximally away from the respective outer peripheral ends toward one side of a diagonal 500 disposed from opposite corners C1, C3 of the DCP 400.

The DCP 400 also includes, c) Nmax parallel and spaced apart column delay signal input lines 406[j], each separately connected at a respective outer peripheral end to a corresponding one of the delayed signal outputs 213[j] from the series delay block 260; and d) Nmax parallel and spaced apart row switch outputs lines 409[j] are each separately connected at a respective outer peripheral end to the corresponding matrix output xout[j] of the cross point select matrix 250; and e) where M=N=Nmax. The column lines 406[j] are not parallel to the row switch output lines 409[j] and are both directed proximally from the respective outer peripheral ends toward the opposite side of the diagonal 500.

The row select input lines 402[j] and row switch outputs 409[j] may be aligned or be offset from each other. The column input signal 406[j] and column select input lines 404[j] may also be aligned or be offset from each other.

An array of the switches sx[j], $1 \leq j \leq Nmax$, is disposed generally along the diagonal 500 across the DCP 400. Each switch sx[j] is disposed at each intersection of row select lines 402[m=j] and column select lines 404[n=j]; i.e., only at the intersections where j=m=n. Each switch sx[j] includes a two input AND gate 410[j]. One input of each AND gate 410[j] is connected to the corresponding row select line 402[j] and the other input is connected to the corresponding column select line 404[j]. AND gate 410[j] drives a base input 412[j] of an adjacent NPN transistor switch 414[j] that has its collector 416[j] connected to an opposite proximal end of the corresponding column delay signal input line 406[j] and its emitter 418[j] connected to the corresponding opposite proximal end of the row switch output 409[j].

A logic "1" is required in both the AND gate row select inputs 402[=Nd] and the AND gate column select inputs 404[j=Nd] to form an electrical connection between a column input signal line 406[j=Nd] and row output signal line 409[j=Nd] whereby the particular delayed clock/data signal 102'+Nd*Δt may pass therethrough. It is apparent that the CAS column address select signals 404[n] (from yc[n]) and RAS row address select signals 402[m] (from xr[m]) are spatially well separated from the delayed input clock signals 406[j] (from xout[j]) and switched delayed output signals xout[j] except for their end-to-end proximity near the AND inputs 406[j] and 409[j] along the diagonal 500.

This spatial separation tends to minimise coupling between the switch logic selection signals and the critical delayed signal edges thereby tending to improve isolation between control and signal data.

The selection of the NPN transistor 414[j] is applicable to one embodiment of the invention. An N-channel FET could also be used Alternatively a PNP transistor or P-channel FET could be used with inverted logic levels.

In an alternative embodiment of the invention, a programmable fixed connection such as an EEPROM programmable FET can replace the active transistor 414[j]. Once a desired delay j*tdel is selected, the matrix 400 could have a selected transistor location m,n=j burned in to establish a fixed delay. Other programmable matrix selection methods are also applicable, such as arrays of metal fuses or anti-fuses as are known in the art.

ECL Implementation of the Series Delay Block

Figure 10:
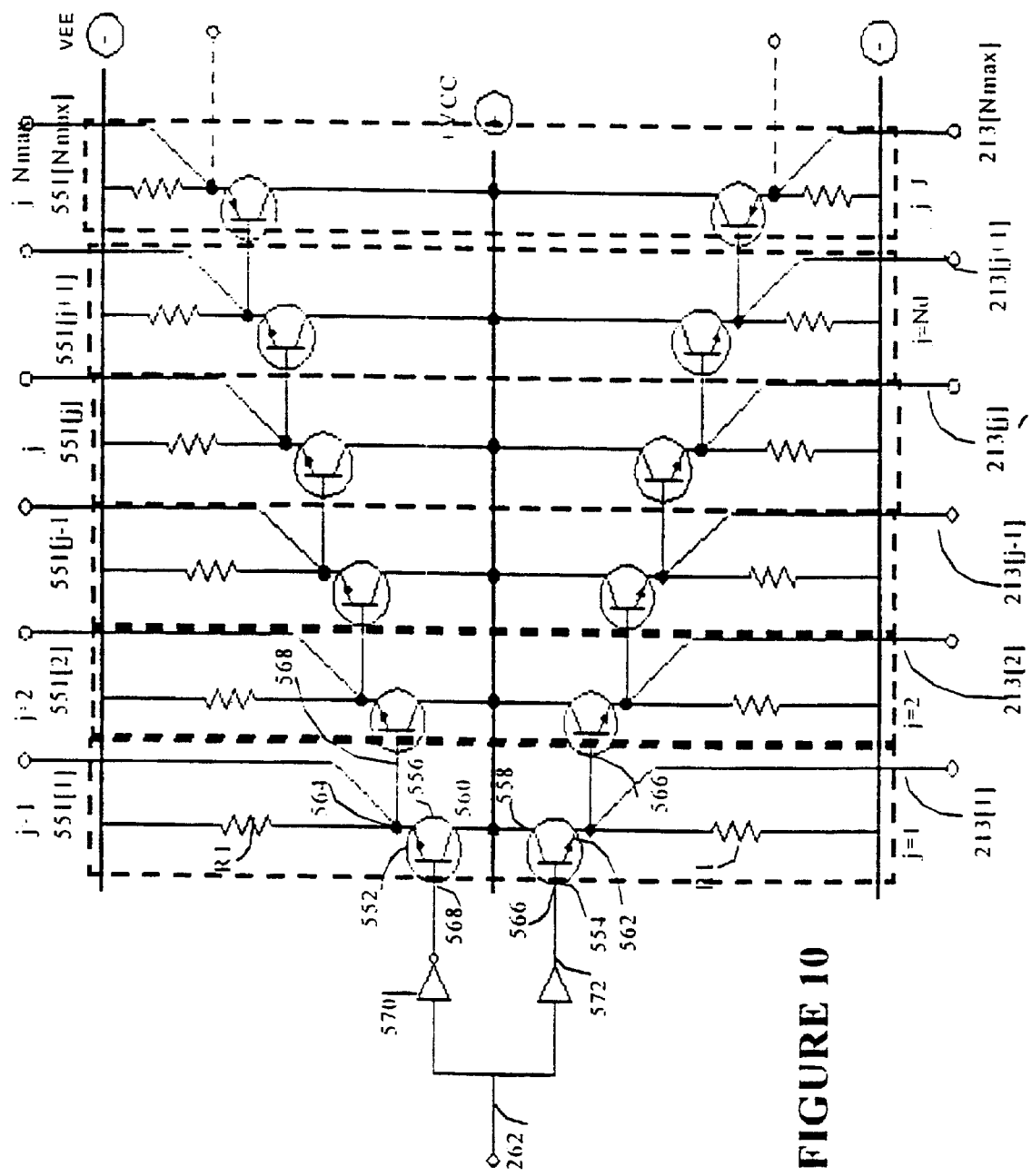
FIG. 10 shows an ECL embodiment of the delay block 260.

Referring now to FIG. 10 there is shown a schematic of one preferred embodiment of a Emitter Coupled logic implementation 550 for the series delay block 260 in the PCD 208 of FIG. 6. The block 260 is composed of a series connection of ECL cells 551[j] $1 \leq j \leq Nmax$. Each cell 551[j] includes two NPN transistors 554 and 556 with collectors 558, 560 joined to a +VCC bus. Separate emitters 562 and 564 form the outputs of each cell 551[j]. Emitter 562 is connected to a −VEE bus through a resistors of value R1 to provide the proper bias to the transistor 554. Emitter 564 is also connected to the −VEE bus by a resistor of value R1. Independent bases 566 and 568 of transistors 554 and 556 are respective inputs of each cell 551[j].

A first stage, 551[1], has base connection 568 of transistor 556 driven by an output of an inverter 570. The transistor 554 of 551[1] has base connection 566 driven by an output of a buffer 572. Both inverter 570 and buffer 572 are driven by the delay block input 262 of FIG. 6. The emitter outputs 562 and 564 are therefore logically complementary. The emitter outputs 562 and 564 are separately connected to respective base inputs 566 and 568 of a second delay stage 551[2] replicating the cell 551[1]. Successive series replicates 551[j] of the cell 551[1] connect output emitters 562, 564 of cell 551[j] to input bases 566, 568 of cell 551[j+1] and are chained together to form the delay block of length Nmax.

Each stage, 551[j], of the delay block 550 has one of the transistor emitters 562 of each stage connected to the cross point select matrix 250 of FIG. 6 as the corresponding delayed clock signal 213[j]. Each stage, 551[j], adds its own characteristic time delay, Δt, to the delay of the input signal to that stage, 213[j−1]. The total delay from the input 262 to output 213[Nd] of the Nd-th cell again is Nd*Δt (not including excess delay if any, through the buffer 572 and inverter 570).

In other embodiments of the present invention, the complementary emitter output 564 of each stage, j, may be connected to external circuitry (not shown) as a complementary delayed output having essentially the same delay j*Δt as the output 213[j].

The inverter 570 and complementary buffer 572 in combination with the dual transistor cells 551[j] provide a balanced power supply current drain behaviour for the network to which the delay line of FIG. 10 is connected. When one transistor e.g., 556, of the cell 551[j] is conducting heavily, the other transistor, 554, of the cell is conducting less, thereby balancing the total current drain on the VEE and VCC power buses.

One half of the cell 551[j] (e.g., transistor 556 and associated resistor R1) may be omitted in cases where current balance is unimportant. The cells 551[j] may be formed by conventional photolithographic processes on a single integrated circuit, or may be individual devices wired together on a printed circuit board.

ECL Delay Stage Coupling by Level Shifting

Figure 11:
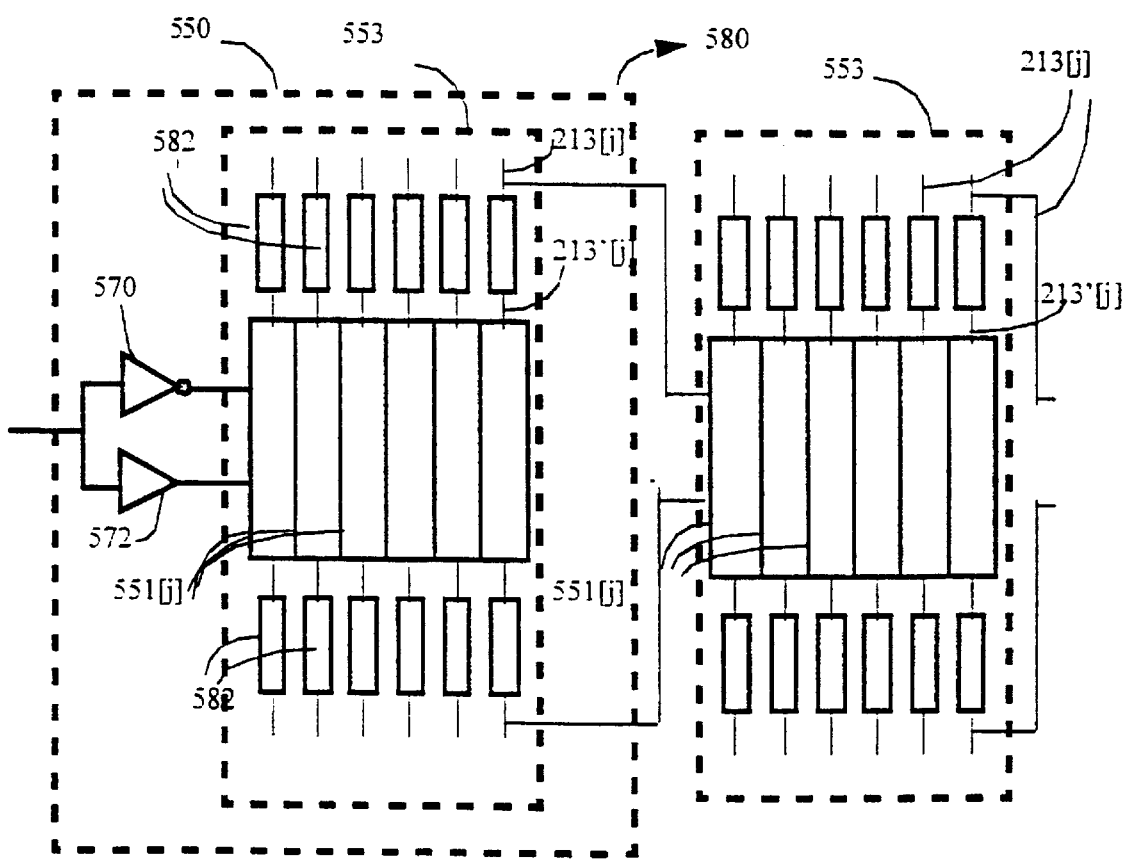
FIG. 11 illustrates an alternative ECL delay block including level shifters.

Referring to FIG. 11 there is shown an example 580 of the ECL delay line of FIG. 10 in which the length of the delay line (i.e., the number of delay cells, Nmax) is extended by including level shifting circuitry. The ECL delay line 580 is comprised of a first delay line stage 550 as shown in FIG. 10 and a second delay line stage 553. The first delay line comprises series cells 551[j] with a first cell driven by the buffer 572 and complementing inverter 570. Each cell 551[j] has its output 213'[j] driving an input of an ECL level converter circuit 582. Each circuit 582 has its output 231[j] providing the signal at 213'[j] with the ECL level restored. ECL level restoring circuits are found for example in U.S. Pat. Nos. 4,435,654 by Koide; 4,978,871 by Jordan and 5,237,220 by Kurashima.

The last cell 551[j] of delay line stage 550 also has its restored level output 213[j] driving the input of the next stage 553. ECL delay lines for the PCD of any desired number of delay cell 551[j] can be built by concatenating the stages 553.

CMOS Implementation of Series Delay Block

Figure 12:
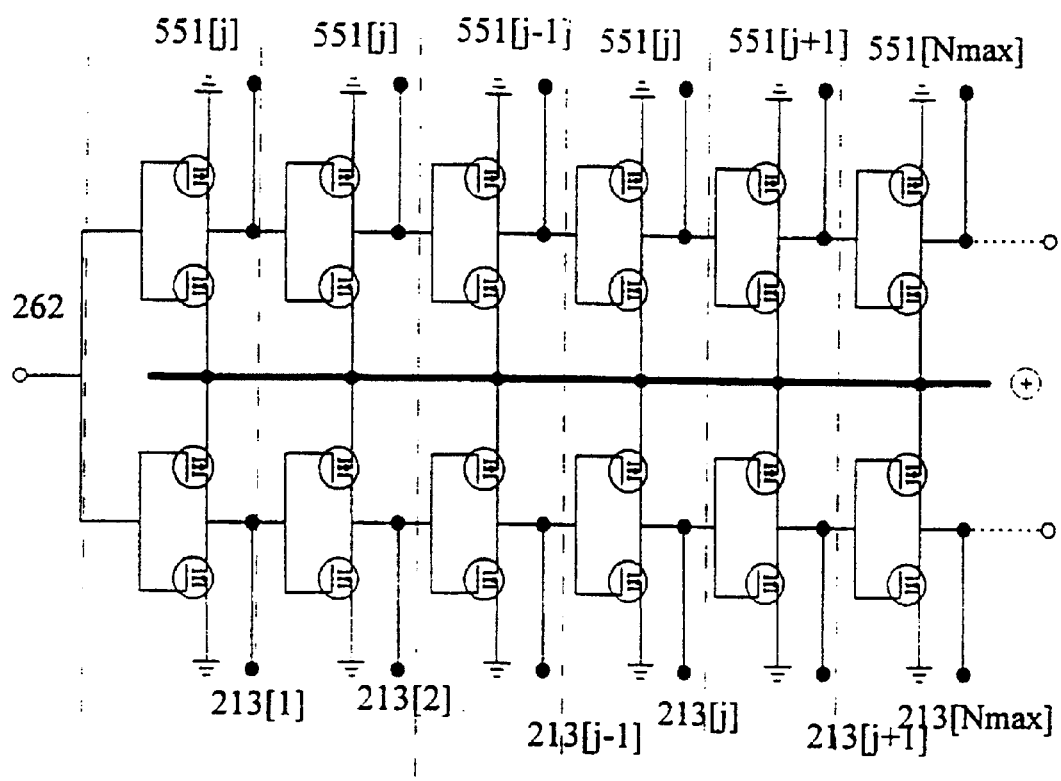
FIG. 12 depicts a CMOS embodiment of the delay block 260.

Referring to FIG. 12, there is shown a CMOS implementation of the series delay block 260 of FIG. 6 in which the cells 551[j] are implemented with CMOS inverters in place of the transistor-resistor combination of FIG. 10 and the inverters 570, 572 are omitted.

It is apparent that the delay element type in the delay line block 250 may be of a different technology than the element type in the other blocks, e.g., the address decode blocks 226, 228 and select matrix 250 or output select logic block 252.

It is contemplated that the delay line block 250 may be a high-speed technology such as ECL, and the other blocks be CMOS for example. In addition, the element type of the network to which the PCD may be connected may also be of a different type. For example, the network that connects to nodes 216, 212 may be a PC motherboard or other printed circuit board. Alternatively, the network may be an integrated circuit or hybrid circuit with the PCD 208 connected thereto.

In order to obtain high resolution in adjusting time delays, it is an advantage to have delay elements 209[j] made from the highest speed (i.e., shortest Δt) technology available; for example, in ECL technology or in High Electron Mobility transistor (HEMT) technology. For a fixed base clock pulse width, a faster delay element 209[j] consequently requires Nmax be proportionately increased to cover all possible divisions (multiplications) of the base clock pulse width (frequency).

Networks With Multiple PCDs.

Figure 13:
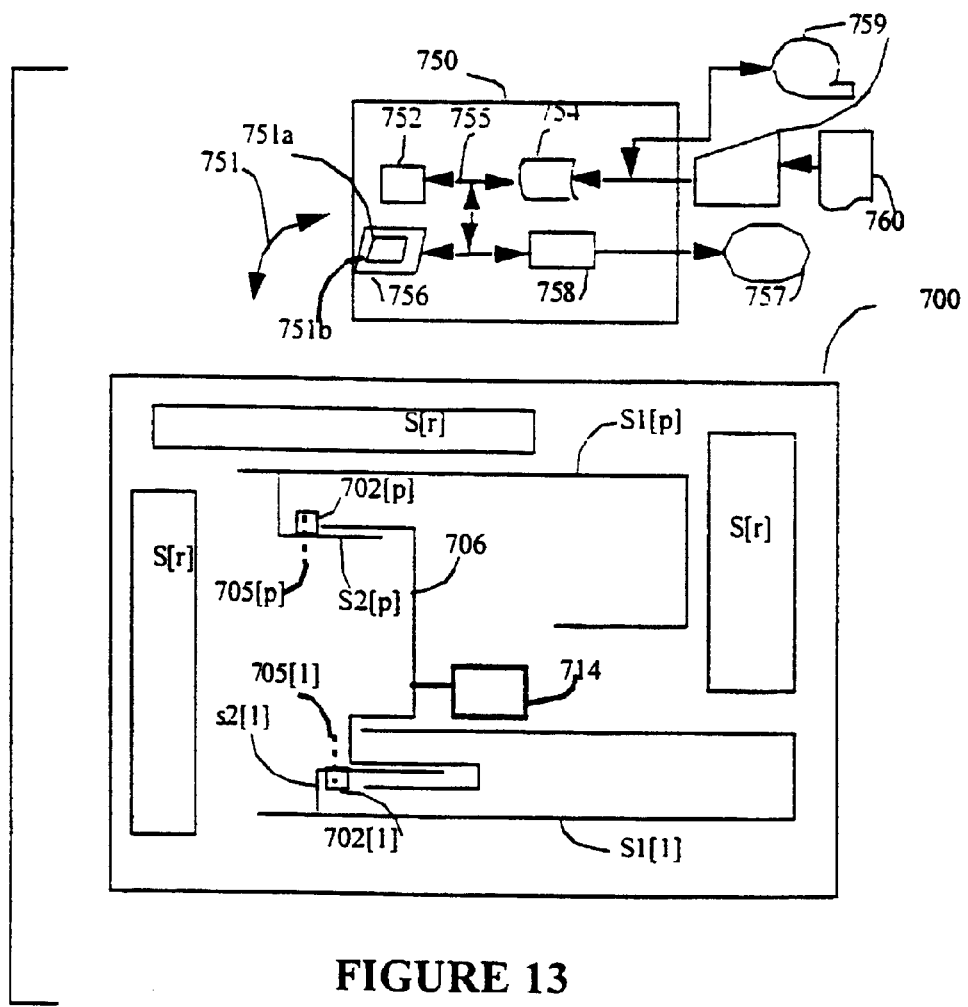
FIG. 13 illustrates a PCB with timing mismatches of the layout 700 modified by the addition of PCD devices in accordance with this invention.

With regard to FIG. 13, there is shown a network 700 The network 700 includes a plurality of associated pairs of digital pulse signal paths S1[p] and S2[p] of different electrical lengths (delay) Δt1[p] and Δt2[p] where Δt2[p] >Δt1[p] from one common end connected to associated digital pulse signal sources 704[p] to respective distal ends. Other signal paths S[r] not having critical timing relationships are not shown.

Where it is desired that the electrically shorter path S2[p] have the same or nearly the same delay as S1[p] from the common ends of S1[p] and S2[p] to the respective distal ends, the shorter signal paths S2[p] are provided with a respective PCD 702[p] connected in series at insertion nodes 705[p] therein as indicated by the dashed lines.

Figure 14:
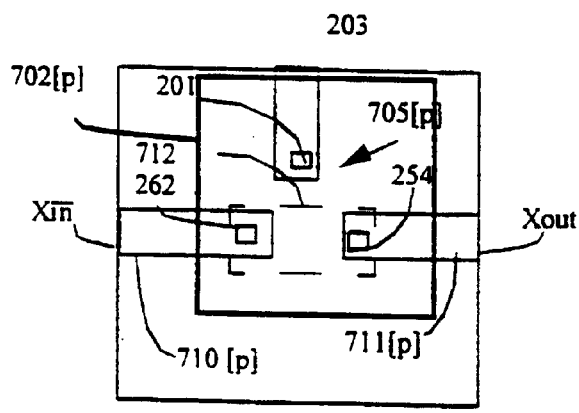
FIG. 14 depicts one option for inserting the PCDs of FIG. 13 into the PCB layout 700.

Referring to FIG. 14, insertion nodes 705[p] include two electrically isolated adjacent lands 710[p] and 711[p] joined by a removable conductive link 712[p]. Each PCD 702[p] is connected to a central control bus 706. Central control bus 706 is connected to programming means 714. Programming means 714 communicates to all the PCDs to set up delays Δtp[p] determined for each PCD[p] that cause the combination of the path S1[p] and PCD 702[p] to match delays Δt2[p] of associated signal paths S2[p] within the precision of the PCD delay element Δt, i.e., Δtp[p]+Δt1[p]=Δt2[p]+/−Δt. The removable link 712[p] may be removed by physically cutting after a PC board is fabricated and measured, or may be part of the photolithography-etching process during manufacture.

Alternatively, the delays Δt2[p]>Δt1[p] may be measured on an actual circuit board 700, and individual PCD circuits having delays Δtp[p] determined and programmed externally may be installed in pre-assigned lands 710[p].

PCD Design Tool Embodiment

A PCD circuit layout and timing design tool (CLDT) and PCD network design process in accordance with an embodiment of the present invention, are indicated by the numerals 750 and 751 respectively. The CLDT 750, e.g., a CAD system, includes a computing resource 752, (such as a SUN™ computer workstation, a high end Pentium™ PC or a mainframe computer), an on-line disc storage system 754, an integrated circuit design program and tool set 756, and a display 757 presenting a graphical user interface GUI 758 coordinating the computing resource 752, the storage system 754 and the design program 756 with circuit design and verification data base I/O 759 (e.g., document entry from magnetic tape and/or keyboard and manual net list) by means of internal bus 755.

Referring again to FIGS. 4, 5, 6 and FIG. 13, the CAD program 756 must include the following prior art capability: 1) convert a predefined net list (circuit element and terminal name lists, terminal-to-terminal connection list) and predefined physical layout of circuit element terminals into an interconnected physical PCB layout for the technology of interest. 2) perform timing analysis of all signal paths, S[r], on the PCB 700 with a verification portion (not shown) of design database 759. 3) identify all critical pairs S1[p] and S2[p] of signal paths S[r] that have a common pulse source (204) and a critical timing difference tdel=t2−t3 as do paths 214 and 215. CAD programs of this type are available in the marketplace and more will be developed in the future.

The PCD network design process 751 of the present invention is represented as a two headed arrow to indicate the iterative relationship between the circuit design data base 759, the PCD cells 702[p] and the PCD network layout 700. A particular implementation of the PCD network design process 750 is represented by the process symbol 75 1a signifying the portion of the CAD program 756 which controls the configuration of the PCD cells 702[p].

Referring to Table 1, there are shown the pertinent steps of a PCD network layout process. 751a in accordance with the present invention after the preparation of the circuit design database 759 (not a part of this invention). Represent the circuit design database 759 prior to physical layout as the set of all pertinent signal paths S[r]. S[r] by itself has inadequate indicators for signal path electrical length (i.e., delay time from a proximal circuit node or terminal to a distal circuit node or terminal) since a physical signal path length L[r] is not determined until layout is completed.

Therefore a timing analysis of the circuit S[r] would be useless for computing possible delay time compensation since paths S1[p] and S2[p] which have critical timing relationships are not created until the layout is complete. No compensation for the influence of physical and thus electrical path length delt[L[r]] and circuit element delays can be performed until at least one circuit layout pass is complete and the relative timing of signals computed by the timing analysis routine of the CAD program 756. It is only after at least one physical layout 700 is complete that the CAD program timing analysis will include signal paths S1[p], S2[p] that will be found to have critical timing relationships.

TABLE 1

| step | description | goto on step | condition | else goto |
|---|---|---|---|---|
| 10 | input circuit data base, S[r]) (from design input.) | 20 | done | 10 |
| 20 | perform physical layout of S[r] including a predetermined plurality, P, of PCDs with Nd[p] = 0 distributed throughout the layout 700 at corresponding insertion points 705[p]. (from existing cell libraries and CAD programs), according to an a priori decision rule (Rule[P]) | 30 | done | 20 |
| 30 | perform timing analysis using verification database 759 and identify node pairs S1[p] and [S2[p]. (From existing CAD programs) | 40 | done | 30 |
| 40 | Assign corrective Nd(p) for each pair of discrepant signal paths S1[p], S2[p] having common signal source. | 50 | done | 40 |
| 50 | install (or place) PCDs with assigned Nd[p]'s at each insertion point 705[p]. | 60 | done | 50 |
| 60 | End | | | |

The CDLT 750 is used by a knowledgeable person, i.e., a trained IC design engineer, or trained technician to layout printed circuit boards (PCBs) or integrated circuits (ICs) from a circuit design input source 760 (e.g., a net list or the like).

The CDLT is provided with a plurality of PCD cells 702[p] that are placed in the circuit layout (network) 700, each PCD having a predetermined maximum number of delay elements, Nmax[p]. The delay values Δt1[p] for each PCD[P] may be set to zero initially, e.g., Nd[p]=0.

A design process 751 in accordance with the present invention is indicated by the accompanying table 1. Process 751 may proceed with the design tool operator using the design tool 750 to lay out the physical topology 700 of a plurality of circuit paths Si[p], typically from a net list 760. The circuit paths Si[p] typically include path circuit elements (not shown) such as combinatorial logic, chip memory elements, micro controllers and the like with known or specified delays between respective inputs and outputs.

The design tool 750 is programmed (by currently known means) to compute the cumulative delays Δt1[p], Δt2[p] for each path S1[p], S2[p] from known characteristics of the signal path circuit elements. The design tool 750 then computes the associated path delays S1[p] according to the timing analysis portion of the design program 756.

A plurality of PCDs 702[p] and PCD insertion points 705[p] are placed according to a suitable a priori decision rule (R[P]) which may be developed by knowledgeable design persons according to the needs of a particular technology. For example, a simple decision rule is to place PCDs on a grid disposed across the area of a proposed PCB 700 with a fraction, say 5%, of the PCB area allocated to potential PCDs and insertion points 705[p].

The advantage of this design process 751 is primarily in that the layout of the circuit netlist S[r] is only done once and any signal path delay discrepancies for signal paths S1[p], S2[p] can be corrected by simply inserting the selected PCD circuits in the PCB layout 700. Thus a single corrective step provided by the design process 751 can reduce layout iterations.

Another alternative of the process 751 applies to PCBs already completed in final form, with discrepancies in signal path delays for pairs of paths S1[p], S2[p]. Programmable PCD components 702[p] having the structure of the PCD 208 in FIG. 6 may be programmed with an external control 205 to provide a compensating delay Nd*Δt for a signal path S1[p] of a completed PCB 700. The programmed PCD 702[p] can then be inserted in the discrepant path S1[p] by known means for breaking a signal path on a PCB and inserting a component therein.

PCD Architecture Partition Options

Single Package

The entire PCD 208 may be fabricated as a single component for insertion into a printed circuit board, by packaging the PCD 208 in a conventional IC package and presenting the two nodes Xin and Xout and connection 203 as device pins for soldering or socketing to receiving holes or lands provided on such a board. A propagation delay difference, tdel, between the two nodes 212 and 216 may then be eliminated by programming the PCD 208 with a sufficient number of delay stages, Nd, to off set tdel, e.g., selecting Nd to be a number large enough to make |Nd*Δt−tdel| smaller than Δt.

Programming the PCD

Embodiments of the PCD 208 may be programmed by an external programming device (not shown) in the manner described with regard to FIG. 13. External programming devices are well known in the art and are generally easily programmed by persons knowledgeable in that art.

Embodiments of the PCD in accordance with this invention include the PCD 208 and incorporate the controller 205 and control program 207 therein. The addition of a timing delay self test capability to a PCD give rise to another class of PCD devices that are auto-compensating after measuring the discrepant tdel between two S1[p], S2[p] nodes. Alternatively, the desired tdel, may be selected by measuring the undesired delay, tdel, between two S1[p] and S2[p] nodes such as 212 and 216.

It is apparent that a plurality of pairs of clock/signal line-node pairs having associated pairs of clock or signal edges with undesired delay differences there between may exist in any one network. It is also apparent that duplicates of the apparatus and method of the present invention may be used in the manner described herein for compensation of such a plurality of delay differences.

What is claimed is:

1. A pulse clock/signal delay apparatus (PCD) comprising:
   a series-connected chain of N pulse delay stages, $1 \leq N \leq Nmax$, each stage having an input and respective output with a pulse delay of Δt therebetween, the pulse delay stages connected output to following input from a first stage (N=1) to a next-to-last stage (N=Nmax−1);

an input of the apparatus connected to an input of the first stage (N=1) of the N pulse delay stages;

an output of the apparatus connected to an output of an Nd-th stage (N=Nd≦Nmax) of the N pulse delay stages by a Diagonal Cross Point matrix (400), having:

M parallel and spaced apart row select input lines (402[m]) each connected separately at an outer peripheral end to a corresponding one of M row access select (RAS) lines (xr[m]) of a matrix select bus (240);

N parallel and spaced apart column select input lines (404[n]), each connected separately at an outer peripheral end to a corresponding one of N column access select (CAS) lines (yc[n]) of the matrix select bus (240) in which the M row lines (402[m]) are not parallel to the N column lines (404[n]) and both the RAS lines and the CAS lines are directed proximally away from the respective outer peripheral ends toward one side of a diagonal (500) disposed from opposite corners (C1, C3) of the diagonal cross point (DCP) (400);

Nmax parallel and spaced apart column delay signal input lines (406[j]), each separately connected at a respective outer peripheral end to a corresponding one of delayed signal outputs (213[j]) from a series delay block (260);

Nmax parallel and spaced apart row switch outputs lines (409[j]) each separately connected at a respective outer peripheral end to corresponding matrix outputs xout[j], where M=N=Nmax and the column delay signal input lines (406[j]) are not parallel to the row switch output lines (409[j]) and the column delay signal input lines and the row switch output lines are both directed proximally from respective outer peripheral ends toward the opposite side of the diagonal (500).

2. A pulse clock/signal delay apparatus as claimed in claim 1, wherein, the row select input lines (402[j]) and row switch output lines (409[j]) of the diagonal cross point matrix are mutually aligned.

3. A pulse clock/signal delay apparatus as claimed in claim 1, wherein, the row select input lines (402[j]) and row switch output lines (409[j]) of the diagonal cross point matrix are mutually offset.

4. A pulse clock/signal delay apparatus as claimed in claim 1, wherein, the column input signal lines (406[j]) and column select input lines (404[j]) of the diagonal cross point matrix are mutually aligned.

5. A pulse clock/signal delay apparatus as claimed in claim 1, wherein, the column input signal lines (406[j]) and column select input lines (404[j]) of the diagonal cross point matrix are mutually offset.

6. A pulse clock/signal delay apparatus as claimed in claim 1, wherein in the diagonal cross point matrix, an array of switches (sx[j]) is disposed generally along the diagonal 500 across the DCP 400 with a switch (sx[j]) at each intersection of row (402[m=j]) and column (404[n=j]);

each switch (sx[j]) has a respective row input (402[j]) and column input (404[j]) of a two input AND gate (410[j]) disposed essentially at the intersection of row m and column n only where m=n=j; and the AND gate (410[j]) drives a base input (412[j]) of an adjacent NPN transistor switch (414[j]) that has its collector (416[j]) connected to an opposite proximal end of the corresponding column delay signal input line (406[j]) and its emitter (418[j]) connected to the corresponding opposite proximal end of the row switch output (409[j]).

7. A pulse clock/signal delay apparatus as claimed in claim 6, wherein in the diagonal cross point matrix, a logic '1' is required in both of an AND operation of row gate inputs (402[j]) and column gate inputs (404[j]) to form an electrical connection between a column (406[j]) and row (409[j]).

8. A pulse clock/signal delay apparatus as claimed in claim 6, wherein the column address select (CAS) signals (404[n]) (from yc[n]) and row address select (RAS) signals (402[m]) (from xr[m]) are separated from the delayed clock signals (406[j]) and switched output signals (xout[j]) by a spatial separation except for their end-to-end proximity near the AND inputs (402[j] and 404[j]) at the diagonal (500).

9. A pulse clock/signal delay apparatus as claimed in claim 8, wherein the spatial separation tends to minimise coupling between the column address select (CAS) signals (404[n]) and row address select (RAS) signals (402[m]) and the delayed clock signals (406[i]) and switched output signals (xout[j]) thereby tending to improve isolation between control and signal data.

10. A pulse clock/signal delay apparatus as claimed in claim 8, wherein the spatial separation tends to minimise coupling between the column address select (CAS) signals (404[n]) and row address select (RAS) signals (402[m]) and the delayed clock signals (406[j]) and switched output signals (xout[i]) thereby tending to improve isolation between control and signal data.

11. A pulse clock/signal delay apparatus as claimed in claim 1, wherein a plurality of switches is selectable by each combination of a row select input line (402[m]) and column select input line (404[n]).

12. A pulse clock/signal delay apparatus (PCD) comprising:

a series-connected chain of N pulse delay stages, 1≦N≦Nmax, each stage having an input and respective output with a pulse delay of Δt therebetween, the stages connected output to following input from a first stage (N=1) to a next-to-last stage (N=Nmax−1);

an input of the apparatus connected to an input of the first stage (N=1) of the N pulse delay stages;

an output of the apparatus connected to an output of an Nd-th stage (N=Nd≦Nmax) of the N pulse delay stages by a Diagonal Cross Point matrix (400), having:

M parallel and spaced apart row select input lines (402[m]) each connected separately at an outer peripheral end to a corresponding one of M row access select (RAS) lines (xr[m]) of a matrix select bus (240);

N parallel and spaced apart column select input lines (404[n]), each connected separately at an outer peripheral end to a corresponding one of N column access select (CAS) lines (yc[n]) of matrix select bus (240) in which the M row lines (402[m]) are not parallel to the N column lines (404[n]) and both the RAS lines and the CAS lines are directed proximally away from the respective outer peripheral ends toward one side of a diagonal (500) disposed from opposite corners (C1, C3) of the diagonal cross point (DCP) (400);

Nmax parallel and spaced apart column delay signal input lines (406[j]), each separately connected at a respective outer peripheral end to a corresponding one of delayed signal outputs (213[j]) from a series delay block (260);

Nmax parallel and spaced apart row switch outputs lines (409[j]) each separately connected at a respective outer peripheral end to corresponding matrix outputs xout[j], where M=N=Nmax and the column delay signal input lines (406[j]) are not parallel to the row switch output lines (409[j]) and the column delay signal input lines and the row switch output lines are both directed proximally from respective outer peripheral ends toward the opposite side of the diagonal; and an array of switches (sx[j]) is disposed generally along the diagonal 500 across the DCP 400 with a switch (sx[j]) at each intersection of row (402[m=j]) and column (404[n=j]), each switch (sx[j]) having a respective row input (402[j]) and column input (404 [j]) of a two input AND gate (410[j]) disposed essentially at the intersection of row m and column n only where m=n=j; and the AND gate (410[j]) driving a switching input (412[j]) of a device selected from the group of an N-channel FET, and a PNP transistor with inverted logic levels and a P-channel FET with inverted logic levels that has an input (416[j]) connected to an opposite proximal end of the corresponding column delay signal input line (406[j]) and an output (418[j]) connected to the corresponding opposite proximal end of the row switch output (409[j]).

13. A pulse clock/signal delay apparatus (PCD) comprising:

a series-connected chain of N pulse delay stages, 1≦N≦Nmax, each stage having an input and respective output with a pulse delay of Δt therebetween, the stages connected output to following input from a first stage (N=1) to a next-to-last stage (N=Nmax−1);

an input of the apparatus connected to an input of the first stage (N=1) of the N pulse delay stages; and an output of the apparatus connected to an output of an Nd-th stage (N=Nd≦Nmax) of the N pulse delay stages by a Diagonal Cross Point matrix (400), having:

M parallel and spaced apart row select input lines (402[m]) each connected separately at an outer peripheral end to a corresponding one of M row access select (RAS) lines (xr[m]) of a matrix select bus (240);

N parallel and spaced apart column select input lines (404[n]), each connected separately at an outer peripheral end to a corresponding one of N column access select (CAS) lines (yc[n]) of matrix select bus (240) in which the M row lines (402[m]) are not parallel to the N column lines (404[n]) and both the RAS lines and the CAS lines are directed proximally away from the respective outer peripheral ends toward one side of a diagonal (500) disposed from opposite corners (C1, C3) of the diagonal cross point (DCP) (400);

Nmax parallel and spaced apart column delay signal input lines (406[j]), each separately connected at a respective outer peripheral end to a corresponding one of delayed signal outputs (213[j]) from a series delay block (260);

Nmax parallel and spaced apart row switch outputs lines (409[j]) each separately connected at a respective outer peripheral end to corresponding matrix outputs xout[j], where M=N=Nmax and the column delay signal input lines (406[j]) are not parallel to the row switch output lines (409[j]) and the column delay signal input lines and the row switch output lines are both directed proximally from respective outer peripheral ends toward the opposite side of the diagonal (500); and an array of switches (sx[j]) disposed generally along the diagonal 500 across the DCP 400 with a switch (sx[j]) at each intersection of row (402[m=j]) and column (404[n=j]), each switch (sx[j]) having a respective row input (402[j]) and column input (404 [j]) of a two input AND gate (410[j]) disposed essentially at the intersection of row m and column n only where m=n=j, the AND gate (410[j]) driving a switching input (412[j]) of a programmable fixed connection device selected from the group of an EEPROM programmable FET, a programmable metal fuse and a programmable anti-fuse that has an input (416[j]) connected to an opposite proximal end of the corresponding column delay signal input line (406[j]) and an output (518[j]) connected to the corresponding opposite proximal end of the row switch output (409[j]).

14. A pulse clock/signal delay network (200) having a first signal path, (S1[p]) and a second signal path (S2[p]) wherein the first signal path and second signal path have a common end for receiving a pulse edge (102), and the second signal path (S2[p]) is electrically longer than first signal path (S1[p]) by a time delay tdel, such that the pulse edge (102) propagates through the second path (S2[p]) to a distal end of the second path to arrive at a second time instance t2, and the pulse edge (102) propagates through the first path (S1[p]) to a distal end of the first path to arrive at first time instance t1, the difference between t2 and t1 being tdel, said pulse clock/signal delay network comprising:

a series-connected chain of N pulse delay stages, 1≦N≦Nmax, each stage having an input and respective output with a pulse delay of Δt therebetween, the pulse delay stages connected output to following input from a first stage (N=1) to a next-to-last stage (N=Nmax−1), located between an intermediate node (n1a) and an adjacent intermediate node (n1b) formed in the first path (S1[p])by separating the first path (S1[p]) at a node (n1) between the common end and the distal end of the first path (S1[p]) into a first path segment (S1a[p]) from the common end to the intermediate node (n1a) and a second path segment (S1b[p]) between the adjacent intermediate node (n1b) and the distal end of the first path (S1[p]);

an input of the first stage (N=1) being connected to the intermediate node (n1a); and an output of an Nd-th stage (N=Nd≦Nmax) being connected to the adjacent intermediate node (n1b) such that |tdel−Nd*Δt|≦Δt, by a connecting switch comprising a Diagonal Cross Point matrix (400), having:

M parallel and spaced apart row select input lines (402[m]) each connected separately at an outer peripheral end to a corresponding one of M row access select (RAS) lines (xr[m]) of a matrix select bus (240);

N parallel and spaced apart column select input lines (404[n]), each connected separately at an outer peripheral end to a corresponding one of N column access select (CAS) lines (yc[n]) of the matrix select bus (240) in which the M row lines (402[m]) are not parallel to the N column lines (404[n]) and both the RAS lines and the CAS lines are directed proximally away from the respective outer peripheral ends toward one side of a diagonal (500) disposed from opposite corners (C1, C3) of the diagonal cross point (DCP) (400);

Nmax parallel and spaced apart column delay signal input lines (406[j]), each separately connected at a respective outer peripheral end to a corresponding one of delayed signal outputs (213[j]) from a series delay block (260);

Nmax parallel and spaced apart row switch outputs lines (409[i]) each separately connected at a respective outer peripheral end to corresponding matrix outputs xout[j], where M=N=Nmax and the delay signal input column lines (406[j]) are not parallel to the row switch output lines (409[j]) and the column delay signal input lines and the row switch output lines are both directed proximally from respective outer peripheral ends toward the opposite side of the diagonal (500);

whereby the pulse edge (102) propagates through the series connection of path segment S1$a$[p], the Nd pulse delay stages, and path segment (S1$b$[p]) to arrive at a time instance t1', where $|t2-t1'| \leq \Delta t$.

15. A pulse clock/signal delay apparatus as claimed in claim 14, wherein in the diagonal cross point matrix, a logic '1' is required in both of an AND operation of row gate inputs (402[j]) and column gate inputs (404[j]) to form an electrical connection between a column (406[j]) and row (409[j]).

16. A pulse clock/signal delay apparatus as claimed in claim 14, wherein the column address select (CAS) signals (404[n]) (from yc[n]) and row address select (RAS) signals (402[m]) (from xr[m]) are separated from the delayed clock signals (406[j]) and switched output signals (xout[j]) by a spatial separation except for their end-to-end proximity near the AND inputs (402[j] and 404[j]) at the diagonal (500).

17. A pulse clock/signal delay apparatus (PCD) comprising:

a series-connected chain of N pulse delay stages, $1 \leq N \leq Nmax$, each stage having an input and respective output with a pulse delay of $\Delta t$ therebetween, the pulse delay stages connected output to following input from a first stage (N=1) to a next-to-last stage (N=Nmax−1);

an input of the apparatus connected to an input of the first stage (N=1) of the N pulse delay stages;

an output of the apparatus connected to an output of an Nd-th stage (N=Nd≦Nmax) of the N pulse delay stages by a Diagonal Cross Point matrix (400), having:

M parallel and spaced apart row select input lines (402[m]) each connected separately at an outer peripheral end to a corresponding one of M row access select (RAS) lines (xr[m]) of a matrix select bus (240);

N parallel and spaced apart column select input lines (404[n]), each connected separately at an outer peripheral end to a corresponding one of N column access select (CAS) lines (yc[n]) of the matrix select bus (240) in which the M row lines (402[m]) are not parallel to the N column lines (404[n]) and both the RAS lines and the CAS lines are directed proximally away from the respective outer peripheral ends toward one side of a diagonal (500) disposed from opposite corners (C1, C3) of the diagonal cross point (DCP) (400);

Nmax parallel and spaced apart column delay signal input lines (406[j]), each separately connected at a respective outer peripheral end to a corresponding one of delayed signal outputs (213[j]) from a series delay block (260);

Nmax parallel and spaced apart row switch outputs lines (409[j]) each separately connected at a respective outer peripheral end to corresponding matrix outputs xout[j], where M=N=Nmax and the column delay signal input lines (406[j]) are not parallel to the row switch output lines (409[j]) and the column delay signal input lines and the row switch output lines are both directed proximally from respective outer peripheral ends toward the opposite side of the diagonal (500); and an array of switches (sx[j]) disposed generally along the diagonal 500 across the DCP 400 with a switch (sx[j]) at each intersection of row (402[m=j]) and column (404[n=j]), each switch (sx[j]) having a respective row input (402[j]) and column input (404[j]) of a two input AND gate (410[j]) disposed essentially at the intersection of row m and column n only where m=n=j, the AND gate (410[j]) driving a base input (412[j]) of an adjacent NPN transistor switch (414[j]) that has its collector (416[j]) connected to an opposite proximal end of the corresponding column delay signal input line (406[j]) and its emitter (418[j]) connected to the corresponding opposite proximal end of the row switch output (409[j]).

\* \* \* \* \*